United States Patent
Maruo

(10) Patent No.: US 6,828,209 B1
(45) Date of Patent: Dec. 7, 2004

(54) METHODS FOR MANUFACTURING A SEMICONDUCTOR DEVICE INCLUDING A TRENCH ISOLATION REGION

(75) Inventor: Yutaka Maruo, Chino (JP)

(73) Assignee: Seiko Epson Corporation, Tokyo (JP)

( * ) Notice: Subject to any disclaimer, the term of this patent is extended or adjusted under 35 U.S.C. 154(b) by 64 days.

(21) Appl. No.: 09/687,197

(22) Filed: Oct. 14, 2000

(30) Foreign Application Priority Data

Oct. 15, 1999 (JP) .......................................... 11-294126

(51) Int. Cl.⁷ .............................................. H01L 21/76
(52) U.S. Cl. ...................... 438/424; 438/430; 438/435; 438/443; 438/444
(58) Field of Search ................................ 438/400, 424, 438/427, 430, 431, 435, 443–446

(56) References Cited

U.S. PATENT DOCUMENTS

| | | | |
|---|---|---|---|
| 4,571,819 A | * 2/1986 | Rogers et al. | 148/DIG. 133 |
| 4,952,524 A | * 8/1990 | Lee et al. | 438/437 |
| 5,275,965 A | * 1/1994 | Manning | 438/430 |
| 5,387,540 A | * 2/1995 | Poon et al. | 438/430 |
| 5,726,090 A | * 3/1998 | Jang et al. | 438/435 |
| 5,741,740 A | * 4/1998 | Jang et al. | 148/DIG. 50 |
| 5,976,951 A | * 11/1999 | Huang et al. | 438/435 |
| 6,046,487 A | * 4/2000 | Benedict et al. | 257/510 |
| 6,133,113 A | * 10/2000 | Jenq et al. | 438/424 |
| 6,146,970 A | * 11/2000 | Witek et al. | 438/424 |
| 6,329,266 B1 | * 12/2001 | Hwang et al. | 438/424 |

FOREIGN PATENT DOCUMENTS

| | | |
|---|---|---|
| JP | 9-82956 | 3/1997 |
| JP | 11-087490 | 3/1999 |
| JP | 2000-031264 | 1/2000 |

OTHER PUBLICATIONS

Japan Office Action for Japanese Patent Application No. 11–294126 (from which priority is claimed for 09/687,197) dated Mar. 23, 2004 (which lists 9–82956 cited above).

Notice of Reasons of Rejection for Japanese Patent Application No. 11–294126 (from which priority is claimed in U.S. Ser. No. 09/687,197), dated Apr. 8, 2003, which lists JP11–087490 and JP10–193037 (JP2000–031264).

* cited by examiner

*Primary Examiner*—Michael Trinh
*Assistant Examiner*—Khanh Duong
(74) *Attorney, Agent, or Firm*—Konrad Raynes & Victor, LLP; Alan S. Raynes

(57) ABSTRACT

Embodiments include semiconductor devices and a methods for manufacturing the same that suppress deficiencies in the transistor characteristics. A method for manufacturing a semiconductor device includes the steps of (A) forming a polishing stopper layer 14 having a predetermined pattern over a substrate 10, (B) removing a part of the substrate using the polishing stopper layer 14 as a mask to form a trench 16, (C) forming a trench oxide film 18 over a surface of the substrate 10 that forms the trench 16, (D) forming an insulating layer 21 that fills the trench 16 over an entire surface of the substrate, (E) polishing the insulating layer 21 by a chemical-mechanical polishing, (F) removing the polishing stopper layer 14, and (G) etching a part of the insulating layer 21 to form a trench insulating layer 20. The method further includes the step (a) of forming an etching stopper layer 90 for the trench oxide film 18 over the trench oxide film 18 at least above the trench 16, and the etching stopper layer 90 is more resistant to etching than the insulating layer 21 in the step (G).

23 Claims, 14 Drawing Sheets

METHODS FOR MANUFACTURING A SEMICONDUCTOR DEVICE INCLUDING A TRENCH ISOLATION REGION

Japanese patent application no. 11-294126, filed Oct. 15, 1999, is hereby incorporated by reference in its entirety.

TECHNICAL FIELD

The present invention relates to devices and methods for manufacturing semiconductor devices, and more particularly, to devices and methods for manufacturing semiconductor devices having element isolation regions.

BACKGROUND

In recent years, with a further miniaturization of MOS transistors being pursued, a further miniaturization of a region for isolating semiconductor elements from one another is needed. In order to achieve the miniaturization of the region, a variety of trench element isolation techniques are considered. In a typical trench element isolation technique, a trench is provided on a substrate between semiconductor elements, and an insulation material is filled in the trench to isolate the semiconductor elements from one another. One example of the technique is described below.

FIGS. 34 through 37 schematically show in cross section steps of forming a trench element isolation region 123 in which a conventional trench element isolation technique (hereafter referred to as "conventional technique") is conducted.

First, as shown in FIG. 34, a pad layer 112 and a stopper layer 114 are successively deposited on a silicon substrate 110. Then, a resist layer R10 having a specified pattern is formed on the stopper layer 114. The stopper layer 114 and the pad layer 112 are etched, using the resist layer R10 as a mask.

Then, as shown in FIG. 35, the resist layer R10 is removed by an ashing step. Then, the silicon substrate 110 is etched, using the stopper layer 114 as a mask to form a trench 116. Then, an exposed surface of the silicon substrate 110 in the trench 116 is thermally oxidized to form a trench oxide film 118.

Then, as shown in FIG. 36, an insulating layer 120 is deposited over the entire surface in a manner to embed the trench 116. Then, the insulating layer 120 is planarized, using the stopper layer 114 as a stopper. Then, the stopper layer 114 is removed by using a heated phosphoric acid.

Then, protruded portions 122 of the insulating layer are isotropically etched by an etchant including a hydrofluoric acid. As a result, the trench element isolation region 123 shown in FIG. 37 is formed. It is noted that the protruded portions 122 of the insulating layer are portions of the insulating layer 120 that protrude from the surface of the silicon substrate 110 in a region where elements are formed.

However, according to the conventional technique, the following problems occur. FIG. 38 schematically shows an expanded view of a portion C of FIG. 37. When the protruded portions 122 of the insulating layer are isotropically etched, a recess 125 is generated in an upper end section of the insulating layer 120. The further the protruded portions 122 of the insulating layer are isotropically etched, the deeper the recess 125 becomes. As the recess 125 becomes deeper, the trench oxide layer 118 is gradually removed in the depth direction of the trench 116 due to the following reasons. As the recess 125 becomes deeper, the trench oxide film 118 is more exposed in the direction of the depth of the trench 116. The trench oxide film 118 and the insulating layer 120 are formed from the same materials, such as silicon oxide. Therefore, the exposed portion of the trench oxide film 118 comes in contact with the etchant, and is isotropically etched. As a result, the deeper the recess 125 becomes, the deeper the trench oxide film 118 is removed in the depth direction. When the trench oxide film 118 is removed and the trench oxide film 118 becomes thinner, problems in the transistor characteristics, such as the inverse narrow channel effect, humps and the like, occur.

SUMMARY

One embodiment relates to a method for manufacturing a semiconductor device having a trench element isolation region including a trench and a trench insulating layer that fills the trench, the method including the steps of (A) forming a polishing stopper layer over a substrate, the polishing stopper layer having a predetermined pattern for a chemical-mechanical polishing; (B) removing a part of the substrate using a mask layer including at least the polishing stopper layer as a mask to form a trench; (C) forming a trench oxide film over a surface of the substrate that forms the trench; (D) forming an insulating layer that fills the trench over an entire surface of the substrate; (E) polishing the insulating layer by a chemical-mechanical polishing; (F) removing the polishing stopper layer; and (G) etching a part of the insulating layer to form a trench insulating layer, wherein the method further includes the step (a) of forming an etching stopper layer for the trench oxide film over at least a portion of the trench oxide film and wherein, in the step (G), the etching stopper layer is more resistant to the etching than the insulating layer.

Another embodiment relates to a semiconductor device comprising trench element isolation regions, wherein at least one of the trench element isolation regions has a trench oxide film formed on a surface of a substrate that forms a trench and a trench insulating layer formed in the trench, wherein an etching stopper layer is formed such that a surface of the trench oxide film on a side wherein the trench insulating layer is formed is not exposed.

Another embodiment relates to a semiconductor device comprising trench element isolation regions, wherein at least one of the trench element isolation regions includes a trench oxide film formed on a surface of a substrate that forms a trench and a trench insulating layer formed in the trench. The device also includes an etching stopper layer formed between the trench oxide film and the trench insulating layer.

Still another embodiment relates to a method for manufacturing a semiconductor device, including forming a trench comprising a lower surface and two side surfaces in a substrate comprising silicon and forming a trench oxide layer on the lower surface and side surfaces. The method also includes forming an etch stop layer in direct contact with the trench oxide layer on the lower surface and side surfaces, and filling the trench with an insulating layer directly contacting the etch stop layer, wherein the insulating layer overfills the trench and extends above the trench as defined by the two side surfaces. The method also includes etching the insulating layer using an etchant that selectively etches the etch stop layer at a rate that is slower than that of the insulating layer.

BRIEF DESCRIPTION OF THE DRAWINGS

Certain embodiments of the invention are described with reference to the accompanying drawings which, for illustrative purposes, are schematic and not necessarily drawn to scale.

DETAILED DESCRIPTION

Certain embodiments relate to semiconductor devices and methods for manufacturing the same that suppress the problems described in the background section related to transistor characteristics.

One embodiment provides a method for manufacturing a semiconductor device having a trench element isolation region including a trench and a trench insulating layer that fills the trench. The method comprises steps of: forming a polishing stopper layer having a predetermined pattern for a chemical-mechanical polishing over a substrate; removing a part of the substrate, using a mask layer including at least the polishing stopper layer as a mask, to form a trench; forming a trench oxide film over a surface of the substrate that form the trench; forming an insulating layer that fills the trench over an entire surface of the substrate; polishing the insulating layer by a chemical-mechanical polishing; removing the polishing stopper layer; and etching a part of the insulating layer to form a trench insulating layer, wherein the method further includes the step of forming an etching stopper layer for the trench oxide film over the trench oxide film at least above the trench, and wherein the etching stopper layer is more difficult to be etched compared with the insulating layer.

Figure 38:
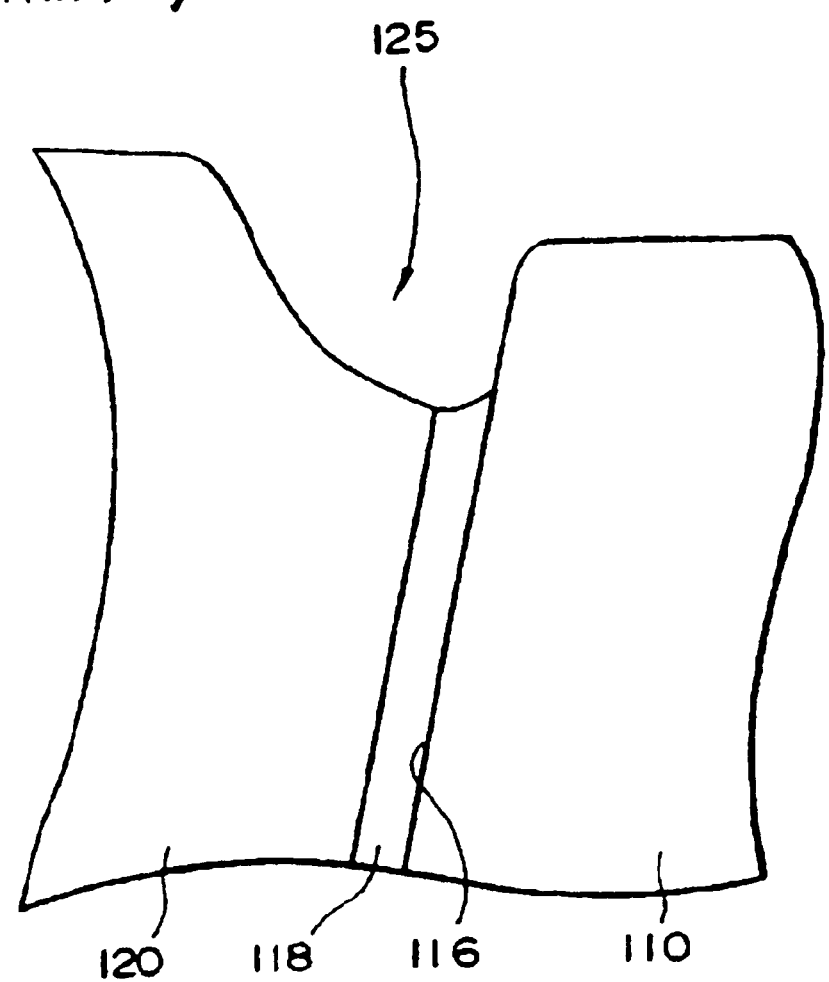
FIG. 38 illustratively shows an expanded view of portion C of FIG. 37.

In accordance with the method described above, the trench oxide film is more difficult to be removed compared with the conventional technique. Reasons for this are described below. With the conventional technique a recess is created at an upper end section of the insulating layer, as shown in FIG. 38. However, in accordance with the embodiment described above, an etching stopper layer for the trench oxide film is formed over the trench oxide film at least above the trench. The etching stopper layer is more resistant to etching than the insulating layer. Therefore, even when a recess is formed in a upper end section of the insulating layer, the contact of the etchant with the trench oxide film from one side (from the side of the recess) is suppressed when compared with the conventional technique due to the presence of the formed etching stopper layer. In other words, etching of the trench oxide film from the side is difficult to progress. Therefore, in accordance with the method described above, the trench oxide layer is more difficult to be removed compared with the conventional technique. As a result, the method provides a semiconductor device in which deficiencies in the transistor characteristics, such as the inverse narrow channel effect and humps, are suppressed.

Also, in accordance with the method described above, the etching of the trench oxide film from the side is difficult to progress. Accordingly, the trench oxide film can be made thinner. As a result, the method is particularly useful when the miniaturization of semiconductor devices is sought. More particularly, the method is particularly useful when the design rule is 0.18 $\mu$m or less.

Also, a selective etching ratio of the insulating layer with respect to the etching stopper layer (an etching rate of the insulating layer divided by an etching rate of the etching stopper layer) may preferably be ten (10) or greater. The etching stopper layer is hardly etched, if at all, with such a selection ratio. Therefore, the contact of the etchant with the trench oxide film in a lateral direction is inhibited, and the etching of the trench oxide film in the lateral direction hardly progress. As a result, the method provides a semiconductor device in which deficiencies in the transistor characteristics, such as the inverse narrow channel effect and humps, are suppressed or not generated.

The etching stopper layer may be formed in a manner to cover a surface of the trench oxide film. Also, another layer may be provided between the etching stopper layer and the trench oxide film.

The etching stopper layer may be formed in accordance with one of the following two preferred embodiments.

First, the etching stopper layer is a silicon nitride layer in accordance with one of the embodiments. The silicon nitride layer has a thickness of 10–50 nm, for example.

Second, the etching stopper layer is a non-monocrystal silicon layer in accordance with the other of the embodiments. For example, the non-monocrystal silicon layer is a polycrystal silicon layer, an amorphous silicon layer or a multiple layer having a polycrystal silicon layer and an amorphous silicon layer. The non-monocrystal silicon layer has a thickness of 20–50 nm, for example. Also, in this embodiment, the method may further include, after etching a part of the insulating layer to form a trench insulating layer, a step for thermally oxidizing a portion of the non-monocrystal layer that protrudes from the surface of the substrate in a element forming region to form a silicon oxide film. By conducting the thermal oxidation step, the silicon oxide film can be removed at the same time when etching a part of the insulating layer to form a trench insulating layer is conducted. As a result, the portion of the non-monocrystal layer that protrudes from the surface of the substrate in the element forming region can be readily removed.

Semiconductor devices according to certain embodiments of the present invention may have structures such as those described below, for example.

In accordance with one embodiment, a semiconductor device has trench element isolation regions, wherein at least one of the trench element isolation regions has a trench oxide film formed on a surface of a substrate that forms a trench, and a trench insulating layer formed in the trench, wherein an etching stopper layer is formed at least over the trench such that a surface of the trench oxide film on the side wherein the trench insulating layer is formed is not exposed.

Also, in accordance with another embodiment, a semiconductor device has trench element isolation regions, wherein at least one of the trench element isolation regions has a trench oxide film formed on a surface of a substrate that forms a trench, a trench insulating layer formed in the trench, and an etching stopper layer formed between the trench oxide film and the trench insulating layer.

As a result, the semiconductor device of certain embodiments suppresses deficiencies in the transistor characteristics, such as the inverse narrow channel effect and humps.

Further, the etching stopper layer may preferably be formed from a material that makes a selection ratio of the insulating layer with respect to the etching stopper layer (an etching rate of the insulating layer/an etching rate of the etching stopper layer) to be ten (10) or greater when an etchant including, for example, hydrofluoric acid, is used. The semiconductor device having an etching stopper layer formed from such a material minimizes or does not cause deficiencies in the transistor characteristics, such as the inverse narrow channel effect and humps.

The etching stopper layer may be formed on a surface of the trench oxide film. Also, another layer may be provided between the etching stopper layer and the trench oxide film.

Also, the etching stopper layer may be formed in the same manner (in terms of the material and the thickness) as described above in the embodiments of the methods for manufacturing semiconductor devices.

Preferred embodiments of the present invention are described below with reference to the accompanying drawings.

Figure 24:
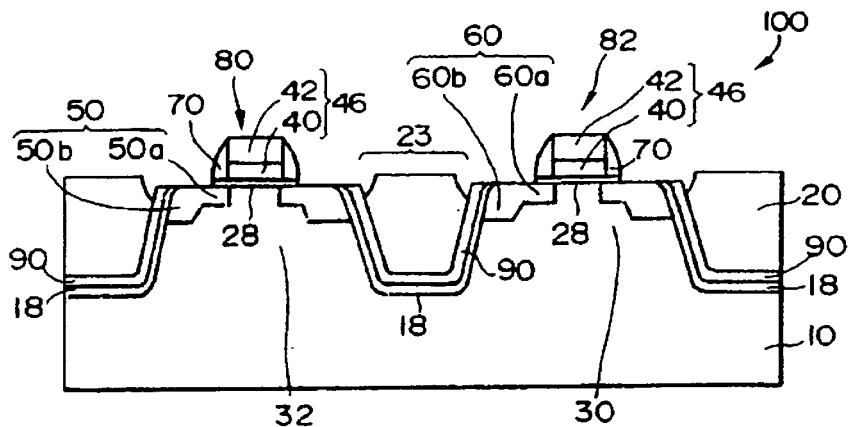
FIG. 24 schematically shows in cross section the semiconductor device in accordance with the first embodiment of the present invention.

A semiconductor device in accordance with a first illustrated embodiment of the present invention will be described below. FIG. 24 shows a semiconductor device 100 in accordance with the first device embodiment.

The semiconductor device 100 includes a trench element isolation region 23, an n-type MOS element 80 and a p-type MOS element 82.

The trench element isolation region 23 includes a trench 16 formed in a silicon substrate 10, and the trench 16 is filled with a trench isolation layer 20. The trench element isolation region 23 isolates the MOS elements from one anther, and plays a role of defining element regions. A trench oxide film 18 and a silicon nitride layer 90 that functions as an etching stopper layer for the trench oxide film 18 are interposed between the silicon substrate 10 and the trench insulating layer 20. The silicon nitride layer 90 is formed in such a manner to cover the trench oxide film 18. A p-type retrograded well 32 is formed in one element forming region on one side of the trench element isolation region 23 as a border, and an n-type retrograded well 30 is formed in the other element forming region.

The n-type MOS element 80 is formed over the p-type retrograded well 32, and the p-type MOS element 82 is formed over the retrograded well 30.

The n-type MOS element 80 includes a gate oxide film 28, a gate electrode 46 and an n-type impurity diffusion layer 50. The gate oxide film 28 of the n-type MOS element 80 is formed over the p-type retrograded well 32. The gate electrode 46 is formed over the gate oxide film 28. The gate electrode 46 is formed from a polysilicon layer 40 and a metal silicide layer 42 formed over the polysilicon layer 40. Sidewall insulation films 70 are formed to cover sidewalls of the gate oxide film 28 and the gate electrode 46. The n-type impurity diffusion layer 50 forms source and drain regions. Also, the n-type impurity diffusion layer 50 has a low concentration n-type impurity diffusion layer 50a and a high concentration n-type impurity diffusion layer 50b, in other words, the n-type impurity diffusion region 50 has an LDD structure.

The p-type MOS element 82 includes a gate oxide film 28, a gate electrode 46 and a p-type impurity diffusion layer 60. The gate oxide film 28 of the p-type MOS element 82 is formed over the n-type retrograded well 30. The gate electrode 46 and sidewalls 70 have the same structure as those of the n-type MOS element 80. The p-type impurity diffusion layer 60 is p-type and other features are the same as those of the n-type impurity diffusion layer 50.

Next, a process for manufacturing the semiconductor device 100 in accordance with the first device embodiment is described. FIGS. 1 through 23 illustrate manufacturing steps in cross-sectional views for manufacturing the semiconductor device 100.

Figure 1:
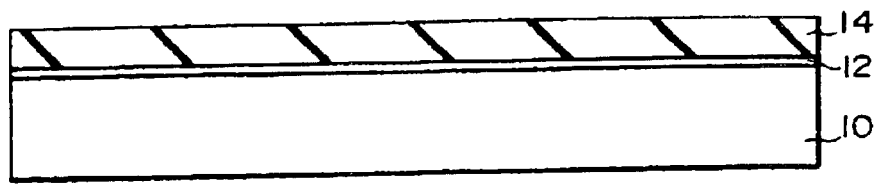
FIGS. 1-23 schematically show in cross section steps of manufacturing a semiconductor device in accordance with a first embodiment of the present invention.

First, referring to FIG. 1, a pad layer 12 is formed over a silicon substrate 10. The pad layer 12 may be formed from a material, such as, for example, silicon oxide and silicon oxide nitride. When the pad layer 12 is formed from silicon oxide, the pad layer 12 can be formed by a thermal oxidation method or a CVD method. When the pad layer 12 is formed from silicon oxide nitride, the pad layer 12 can be formed by a CVD method. The pad layer 12 has a thickness of 5–20 nm, for example.

Then, a polishing stopper layer 14 is formed over the pad layer 12. The polishing stopper layer 14 may be formed from a single layer structure composed of any one of the a silicon nitride layer, a polycrystal silicon layer and an amorphous silicon layer, or a multiple layered structure composed of at least two types of layers selected from a silicon nitride layer, a polycrystal silicon layer and an amorphous silicon layer. The polishing stopper layer 14 may be formed by a known method, such as a CVD method. The polishing stopper layer 14 has a sufficient film thickness that can function as a stopper in the chemical-mechanical polishing process performed later, for example, a film thickness of 50–150 nm.

Figure 2:
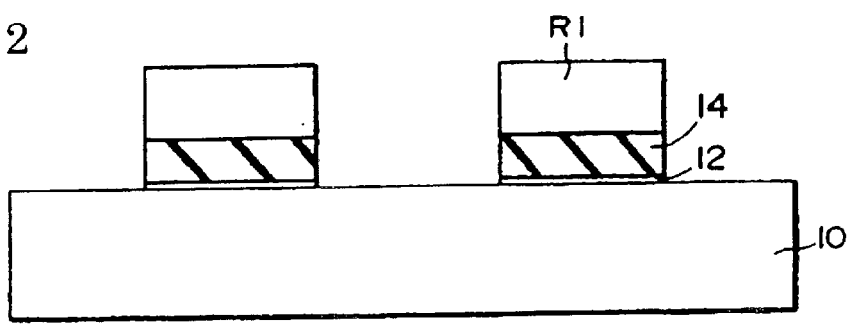

Then, as shown in FIG. 2, a resist layer R1 having a specified pattern is formed over the polishing stopper layer 14. The resist layer R1 has an opening over a region where the trench 16 is formed.

Then, the polishing stopper layer 14 and the pad layer 12 are etched, using the resist layer R1 as a mask. The etching is preferably conducted by a dry etching method.

Figure 3:
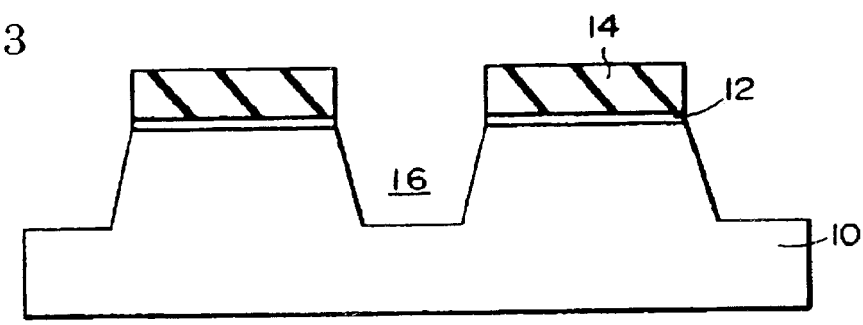

Then, the resist layer R1 is removed by an ashing. Then, as shown in FIG. 3, the silicon substrate 10 is etched, using the polishing stopper layer 14 as a mask to thereby form a trench 16. The depth of the trench 16 may vary depending upon the design of the device, but may be 300–500 nm, for example. The silicon substrate 10 is preferably etched by a dry etching.

Then, although not shown in the figure, end sections of the pad layers 12 that are interposed between the silicon substrate 10 and the polishing stopper layer 14 may be etched depending on the requirements.

Figure 4:
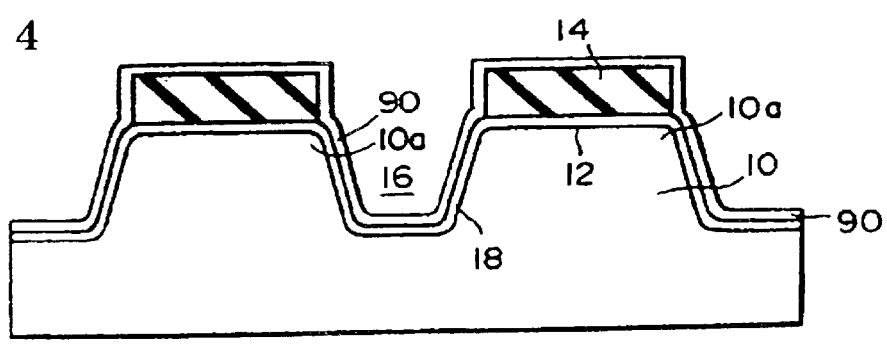

Then, as shown in FIG. 4, exposed surfaces of the silicon substrate in the trench 16 are preferably oxidized by a thermal oxidation method, to thereby form a trench oxide film 18. The trench oxide film 18 may have a film thickness of, for example, 10–50 nm, and more preferably, 10–30 nm. The film thickness of the trench oxide film between 10 nm and 30 nm is preferable for the miniaturization of semiconductor devices. More specifically, the film thickness of the trench oxide film ranging between 10 nm and 30 nm is preferable when the design rule is 0.18 $\mu$m or less. Also, as edge sections of the pad layer 12 are etched through the thermal oxidation, upper edge sections (shoulder sections) 10a of the silicon substrate 10 that defines the trench 16 are oxidized and rounded. As the upper edge sections 10a of the silicon substrate 10 are rounded, a recess 21a (see FIG. 9) is more difficult to form at an upper end section of the trench insulating layer 20 that is described below.

Then, a silicon nitride layer 90 is formed over the entire surface of the substrate including the surfaces of the trench oxide film 18. The silicon nitride layer 90 functions to suppress the removal of the trench oxide film 18 when an isotropic etching with a hydrofluoric acid is conducted in a later step that is described below. In other words, the silicon nitride layer 90 functions as an etching stopper layer for the trench oxide film 18 when an isotropic etching with a hydrofluoric acid is conducted. The detail of the function of the silicon nitride layer 90 will be described later with the description of an isotropic etching of the pad layer 12. The silicon nitride layer 90 may be formed by known methods, for example, CVD (chemical vapor deposition) and PVD (physical vapor deposition). The silicon nitride layer 90 may not be limited to a specific thickness and may be of any thickness if the silicon nitride layer 90 can perform the function. Preferably, the silicon nitride layer 90 may have a film thickness of 10–50 nm. When the thickness of the silicon nitride layer 90 is 10 nm or greater, the silicon nitride layer 90 can securely perform the function as an etching stopper layer for the trench oxide film 18. When the thickness of the silicon nitride layer 90 is 50 nm or less, an insulating layer 21 (that is to be described later) can be better embedded in the trench 16. If the thickness of the silicon nitride layer 90 is greater than 50 nm, the trench 16 becomes narrow, and the aspect ratio of the trench 16 (the depth of the trench divided by the width of the trench) becomes great. This tends to make it more difficult to embed the insulating layer 21 in the trench 16.

Figure 5:
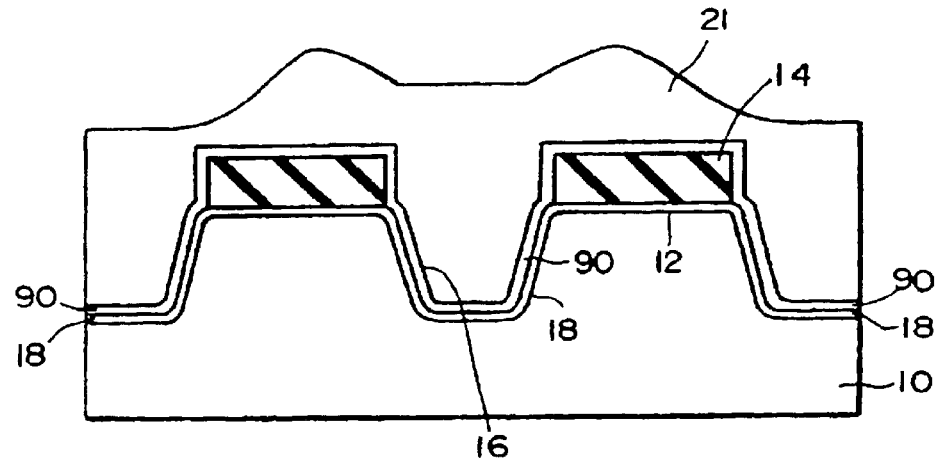

As shown in FIG. 5, an insulating layer 21 is deposited over the entire surface of the substrate in such a manner as to embed the trench 16. The insulating layer 21 may be formed from silicon oxide, for example. The insulating layer 21 may be formed to a film thickness sufficient to embed the trench 16 and at least cover the polishing stopper layer 14. For example, the insulating layer 21 may have a preferred film thickness of 500–800 nm. The insulating layer 21 may be deposited by methods such as, for example, a high-density plasma CVD method, a thermal CVD method, or a TEOS plasma CVD method.

Figure 6:
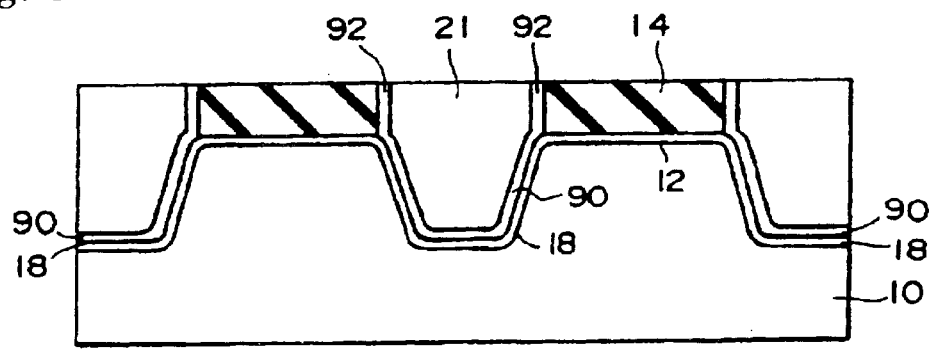

Then, as shown in FIG. 6, the insulating layer 21 is planarized by a CMP method. The planarization is conducted until the polishing stopper layer 14 is exposed. In other words, the insulating layer 21 is planarized, using the polishing stopper layer 14 as a stopper.

Figure 7:
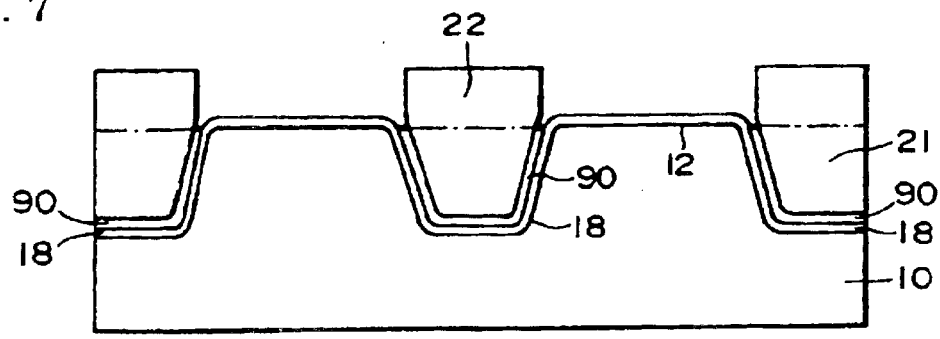

Then, as shown in FIG. 7, the polishing stopper layer 14 is removed, using a heated phosphoric acid, for example. At the same time, protruded portions 92 of the silicon nitride layer (see FIG. 6) that protrude from the surface of the silicon substrate 10 in the device forming region are removed. After the polishing stopper layer 14 is removed, a portion of the insulating layer 21 that protrudes from the surface of the silicon substrate 10 in the device forming region remains. The portion of the insulating layer 21 that protrudes from the surface of the silicon substrate 10 in the device forming region will be referred to below as a "protruded portion 22 of the insulating layer".

Figure 8:
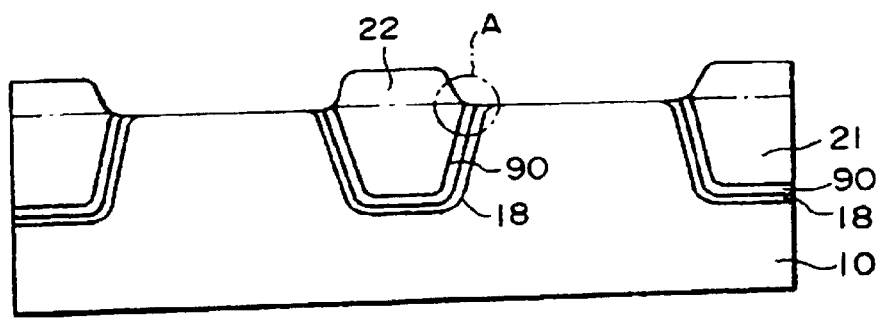

Next, as shown in FIG. 8, the pad layer 12 and the protruded portion 22 of the insulating layer are isotropically etched, using a hydrofluoric acid. Hereunder, the step of isotropic etching is referred to as the "step of light etching of the pad layer 12".

Figure 9:
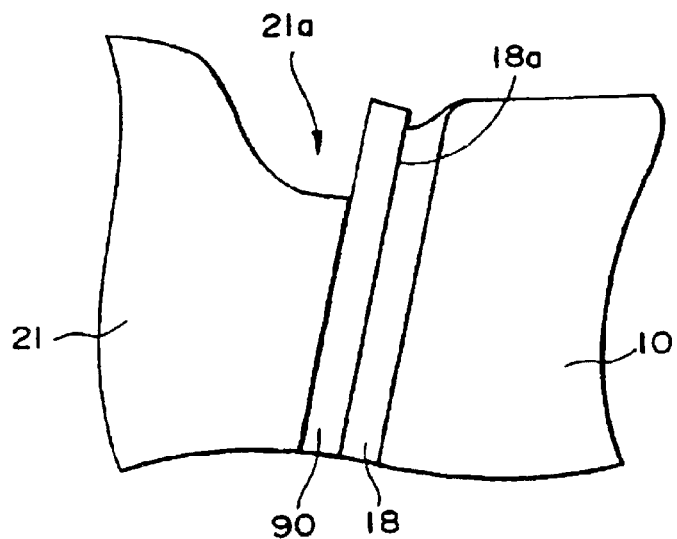

In the step of light etching of the pad layer 12, the silicon nitride layer 90 performs the following functions. FIG. 9 illustratively shows an expanded view of section A of FIG. 8. When the protruded section 22 of the insulating layer is isotropically etched, a recess 21a is created at an upper end section of the insulating layer 21, as shown in FIG. 9. In the conventional technique, when a recess 21a is created, a trench oxide film 18 is exposed, and the exposed trench oxide film 18 is removed (see FIG. 38). However, in accordance with this embodiment, even when the recess 21a is created, the formed silicon nitride layer 90 makes the trench oxide film 18 more difficult to be removed compared with the prior technique because of the following reasons.

In accordance with this embodiment, the silicon nitride layer 90 is formed to cover the trench oxide film 18. The silicon nitride layer 90 is barely removed, if at all, by the hydrofluoric acid, compared with the insulating layer 21. Therefore, even when the recess 21a is created, the silicon nitride layer 90 functions as an etching stopper layer to protect the trench oxide film 18, such that the surface 18a of the trench oxide film 18 on the side of the recess 21a is not exposed. Therefore, etching of the trench oxide film 18 in a lateral direction (from the side of the recess 21a) does not progress. As a result of the formation of the silicon nitride layer 90, the trench oxide film 18 becomes more difficult to be removed compared with the conventional technique.

Figure 10:
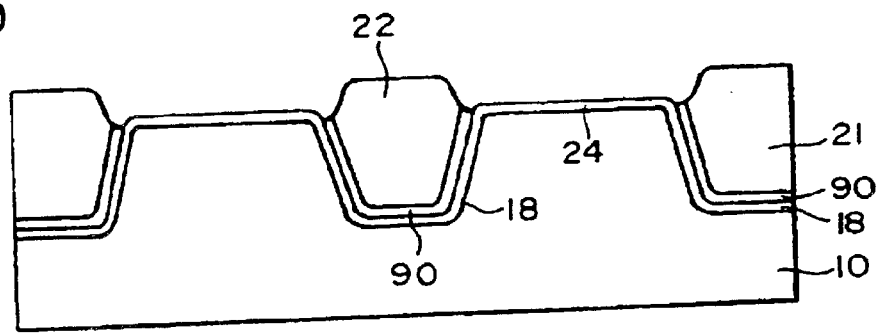

Next, as shown in FIG. 10, a sacrificial oxide layer 24 composed on silicon oxide on the exposed surface of the silicon substrate 10 by a thermal oxidation method. The sacrificial oxide layer 24 may have a film thickness of 10–20 nm, for example.

Figure 11:
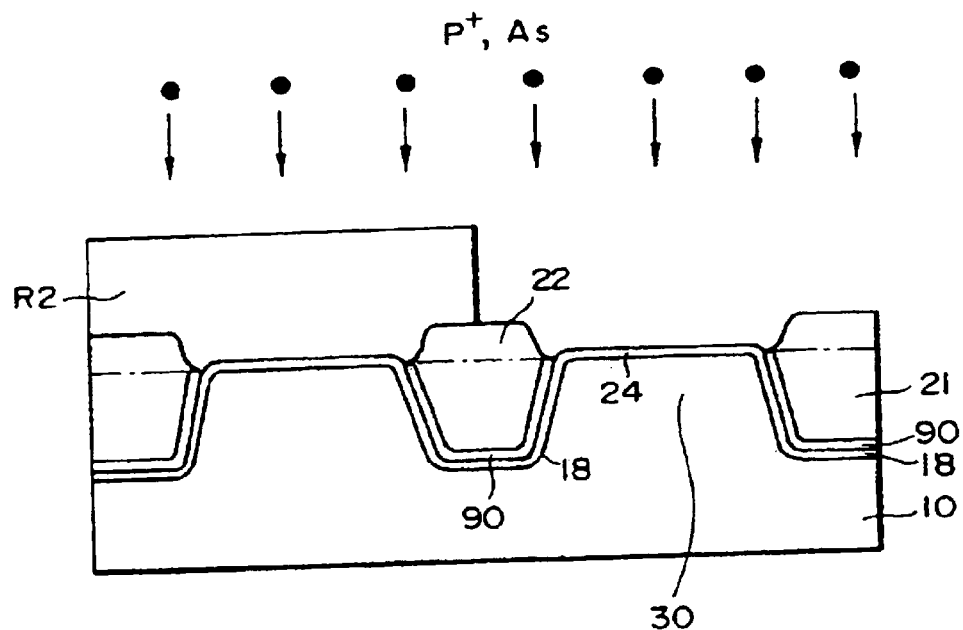

Next, as shown in FIG. 11, a resist layer R2 having a specified pattern over surfaces of the sacrificial oxide layer 24 and the insulating layer 21. The resist layer R2 defines an opening in a region that becomes an n-well. An n-type impurity, such as phosphorous and arsenic is implanted in the silicon substrate 10 once or several times, using the resist layer R2 as a mask, to thereby form an n-type retrograded well 30 in the silicon substrate 10. The retrograded well is a well that has a peak impurity concentration in a deep position of the silicon substrate 10.

Figure 12:
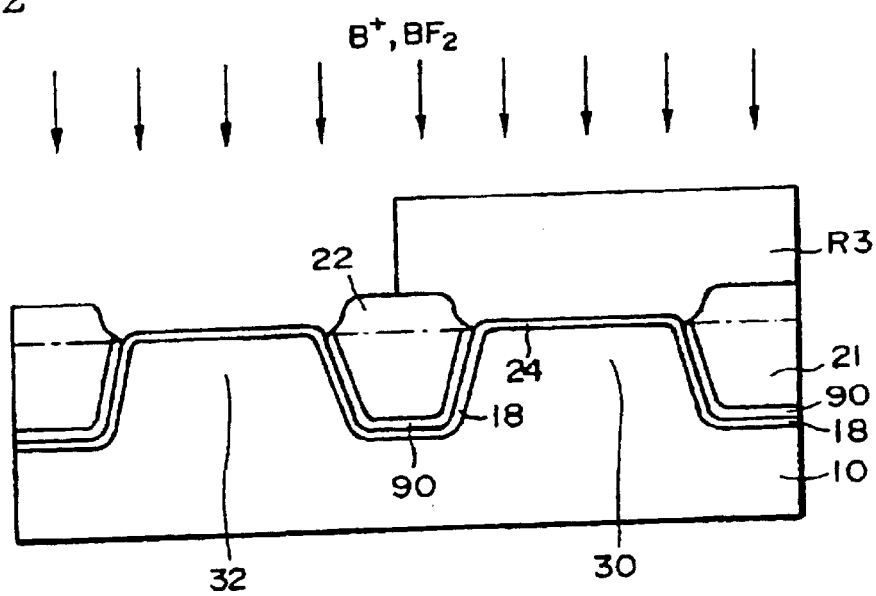

As shown in FIG. 12, a resist layer R3 is formed over surfaces of the sacrificial oxide layer 24 and the insulating layer 21. The resist layer R3 defines an opening in a region that becomes a p-well. A p-type impurity, such as boron is implanted in the silicon substrate 10 once or several times, using the resist layer R3 as a mask, to thereby form an p-type retrograded well 32 in the silicon substrate 10.

Figure 13:
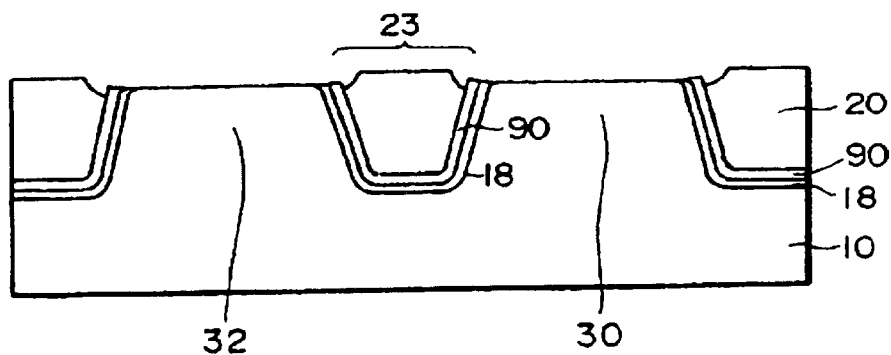

Then, as shown in FIG. 13, the sacrificial oxide film 24 and the protruded potion 22 of the insulating layer are isotropically etched with a hydrofluoric acid or the like to form a trench insulating layer 20. As a result, a trench element isolation region 23 is formed. Hereunder, the step of isotropic etching is referred to as the "step of light etching of the sacrificial oxide film 24". In the step of light etching of the sacrificial oxide film 24, the silicon nitride layer 90 also performs the same function as in the step of light etching of the pad layer.

When the step of light etching of the sacrificial oxide film 24 is completed, the recess 21a may preferably have a depth of 10 nm or less. When the depth of the recess 21a is 10 nm or less, deficiencies such as humps can be more securely suppressed.

Figure 14:
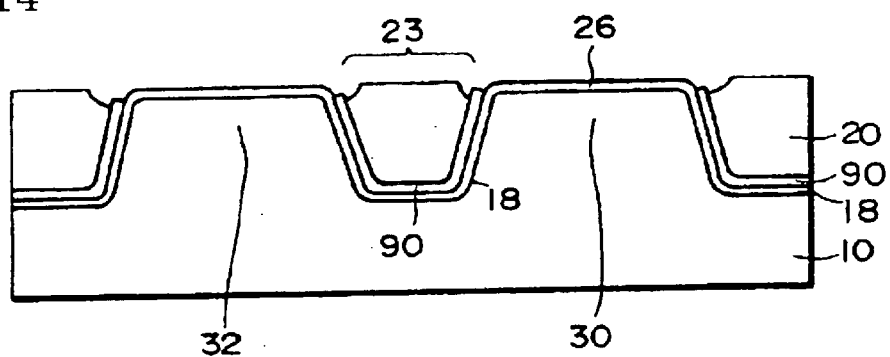

Next, as shown in FIG. 14, an oxide film 26 is formed over surfaces of the silicon substrate 10 over the device forming regions that are defined by the trench element isolation region 23. A part of the oxide film 26 becomes a gate oxide film 28.

Figure 15:
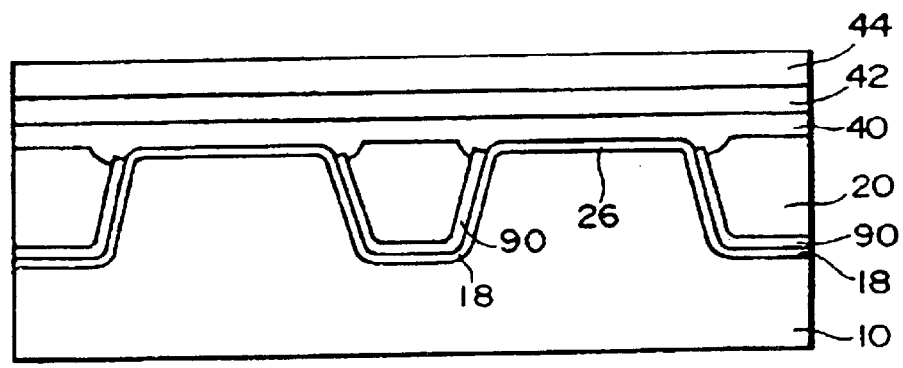

Then, as shown in FIG. 15, a polycrystal silicon layer 40 is formed over the trench insulating layer 20 and the oxide film 26 by a CVD method or the like. The polycrystal silicon layer 40 is doped by a doping method. The doping may be performed by, for example, an in-situ doping method or an ion doping method.

Next, a metal silicide layer 42 is formed over a surface of the polycrystal silicon layer 40. The metal silicide layer 42 may be formed from tungsten silicide, titanium suicide or molybdenum silicide by a sputtering method or a CVD method.

Then, a silicon oxide layer 44 is formed over a surface of the metal silicide layer 42. The silicon oxide layer 44 may be formed by, for example, a CVD method.

Figure 16:
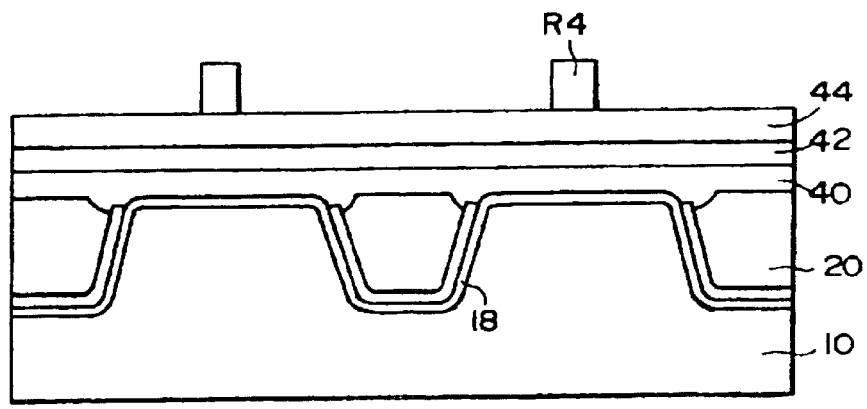
Figure 17:
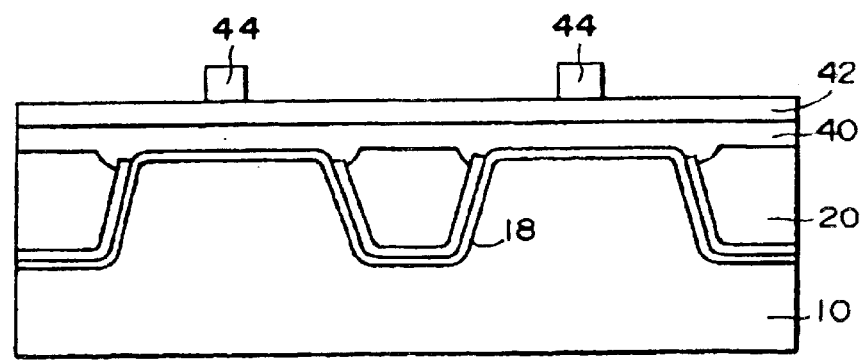

Then, as shown in FIG. 16, a resist layer R4 is formed over the silicon oxide layer 44 to cover a region where a gate electrode 46 is to be formed. Then, the silicon oxide layer 44 is etched, using the resist layer R4 as a mask. Then, as shown in FIG. 17, the resist layer R4 is removed by an ashing method.

Figure 18:
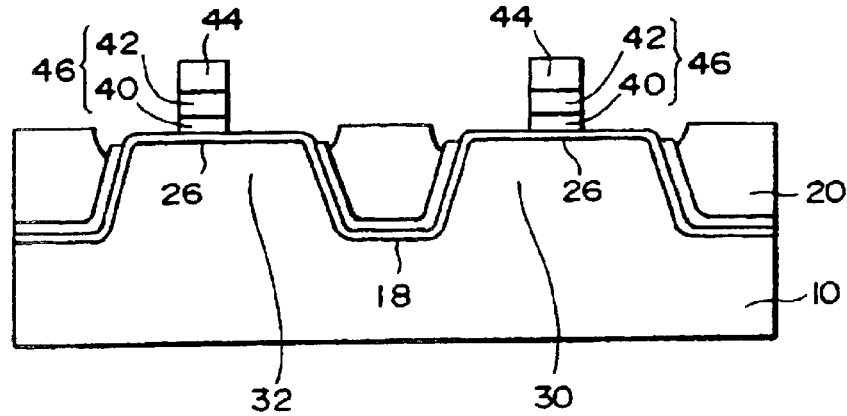

Then, as shown in FIG. 18, the metal silicide layer 42 and the polycrystal silicon layer 40 are etched, using the silicon oxide layer 44 as a mask. In this manner, a gate electrode 46 composed of the polycrystal silicon layer 40 and the metal suicide layer 42 is formed.

Figure 19:
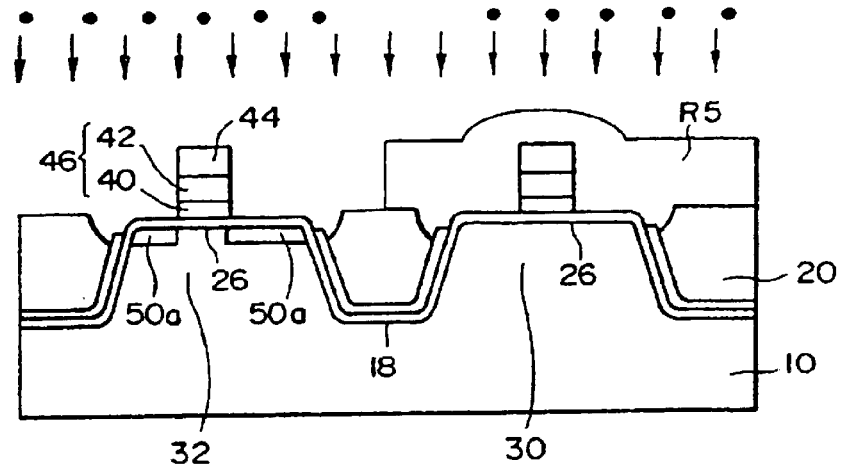

Next, as shown in FIG. 19, a resist layer R5 is formed to cover the n-type retrograded well 30. Ions, such as phosphorous ions are implanted in the p-type retrograded well 32, using the resist layer R5 as a mask. As a result, low-concentration n-type impurity diffusion layers 50a that compose source and drain are formed in the p-type retrograded well 32.

Figure 20:
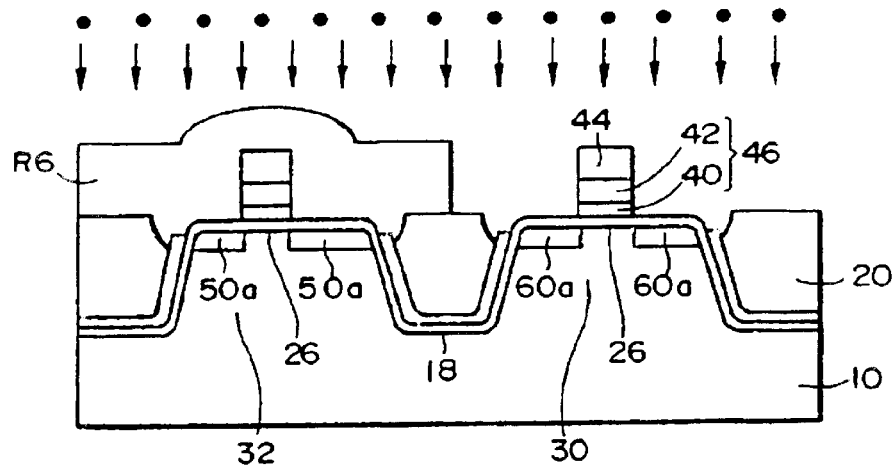

After the resist layer R5 is removed, a resist layer R6 is formed to cover the p-type retrograded well 32, as shown in FIG. 20. Ions, such as boron ions are implanted in the n-type retrograded well 30, using the resist layer R6 as a mask. As a result, low-concentration p-type impurity diffusion layers 60a that compose source and drain are formed in the n-type retrograded well 30.

Figure 21:
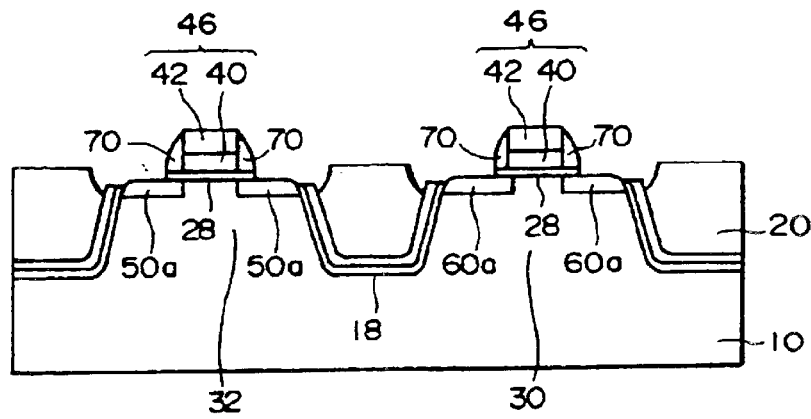

Then, the resist layer R6 is removed, and an insulating layer (not shown), such as a silicon nitride film, a silicon oxide film is formed over the entire surface of the substrate by a CVD method, for example. Then, as shown in FIG. 21, the insulating layer is anisotropically etched by a reactive ion etching or the like to form sidewall insulation films 70.

Figure 22:
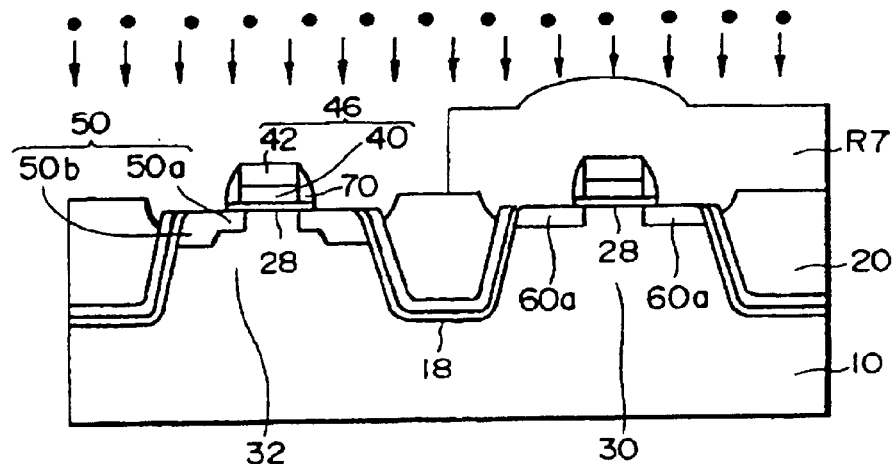

Then, as shown in FIG. 22, a resist layer R7 is formed to cover the n-type retrograded well 30. Ions, such as phosphorous ions are implanted in the p-type retrograded well 32, using the resist layer R7, the gate electrode 46 and the sidewall insulation films 70 as masks, to thereby form high concentration n-type impurity diffusion layers 50b. As a result, n-type impurity diffusion layers 50 with an LDD structure are formed.

Figure 23:
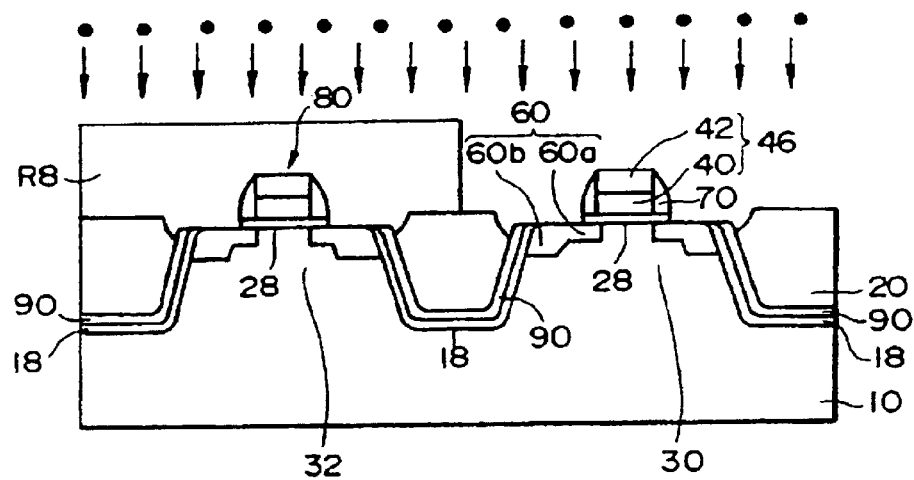

Then, the resist layer R7 is removed, and a resist R8 is formed to cover the p-type retrograded well 32, as shown in FIG. 23. Ions, such as boron ions are implanted in the n-type retrograded well 30, using the resist layer R8, the gate electrode 46 and the sidewall insulation films 70 as masks, to thereby form high concentration p-type impurity diffusion layers 60b. As a result, p-type impurity diffusion layers 60 with an LDD structure are formed.

Then, the resist layer R8 is removed by an ashing. As a result, the semiconductor device 100 shown in FIG. 24 in accordance with the embodiment of the present invention is completed.

This embodiment may provide the following characteristic features. Namely, the silicon nitride layer 90 that covers the trench oxide film 18 is formed as an etching stopper layer. By forming the silicon nitride layer 90, the trench oxide film 18 becomes difficult to be removed in a variety of light etching steps that use a hydrofluoric acid, because of the following reasons.

Through conducting a variety of light etching steps using a hydrofluoric acid, a recess 21a is created at an upper end section of the insulating layer 21 (see FIG. 9). However, the trench oxide film 18 is covered by the silicon nitride layer 90. The silicon nitride layer 90 is barely removed, if at all, by hydrofluoric acid. In this respect, the silicon nitride layer 90 functions as an etching stopper layer to protect the trench oxide film 18, and the surface 18a of the trench oxide film 18 on the side of the recess 21a is not exposed, and etching of the trench oxide film 18 in a lateral direction does not progress, such that the amount of the trench oxide film 18 that may be etched can be reduced. As a result, this embodiment provides a semiconductor device in which deficiencies in the transistor characteristics, such as the inverse narrow channel effect, humps, and the like, are suppressed or not generated.

Also, in accordance with the method for manufacturing the semiconductor device of the first embodiment of the present invention, as described above, etching of the trench oxide film 18 from the side is difficult to progress. Accordingly, the trench oxide film 18 can be made thinner. As a result, the method is particularly useful when the miniaturization of semiconductor devices is sought. More particularly, the method is particularly useful when the design rule is 0.18 $\mu$m or less.

In the step of light etching of the pad layer 12, a hydrofluoric acid is used as an etchant. However, the etchant used in this light etching step is not limited to a hydrofluoric acid, and can be any etchant that can etch the pad layer 12 and the insulating layer 21 at the same time and provides a selection ratio between the silicon nitride layer 90 and the insulating layer 21 (an etching rate of the insulating layer/an etching rate of the silicon nitride layer) to be 10 or greater. When hydrofluoric acid is used, a variety of materials may be added to the hydrofluoric acid as long as the conditions described above are met.

Also, in the step of light etching the sacrificial oxide film 24, the etchant used in the light etching step is not limited to a hydrofluoric acid, and can be any etchant that can etch the sacrificial oxide film 24 and the insulating layer 21 at the same time and provides a selection ratio between the silicon nitride layer 90 and the insulating layer 21 (an etching rate of the insulating layer/an etching rate of the silicon nitride layer) to be 10 or greater. When hydrofluoric acid is used, a variety of materials may be added to the hydrofluoric acid as long as the conditions described above are met.

Figure 33:
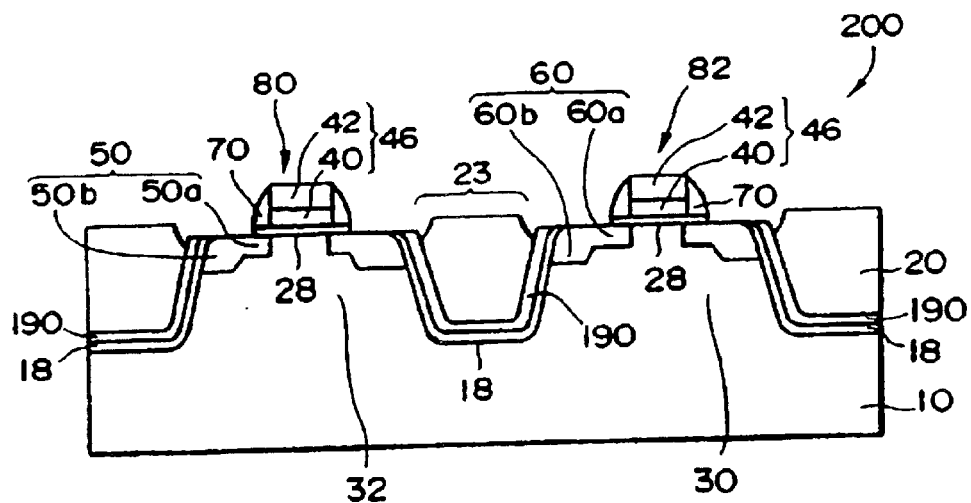
FIG. 33 schematically shows in cross section the semiconductor device in accordance with the second embodiment of the present invention.
Figure 34:
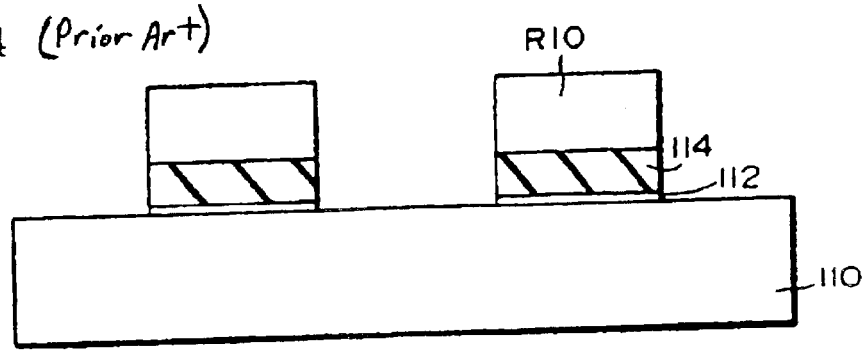
FIGS. 34-37 schematically show in cross section steps of manufacturing a semiconductor device in the conventional technique.
Figure 35:
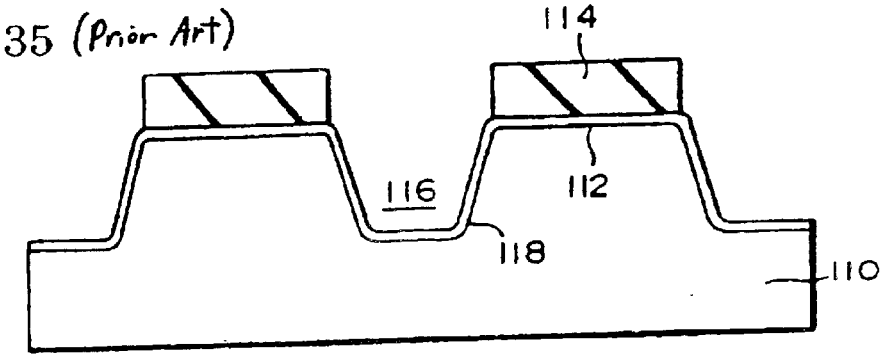
Figure 36:
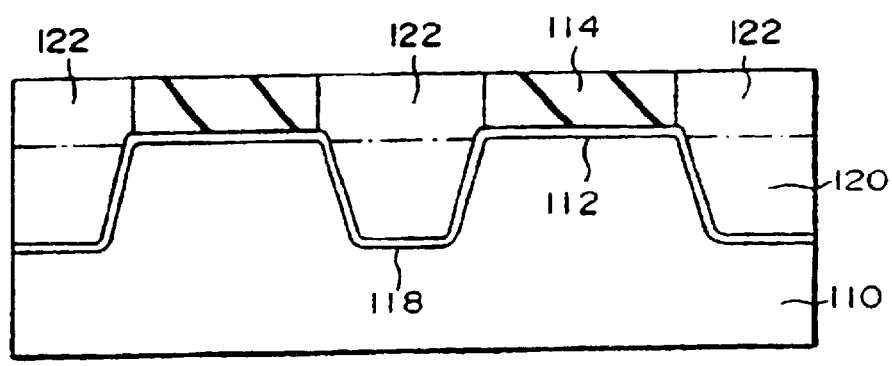
Figure 37:
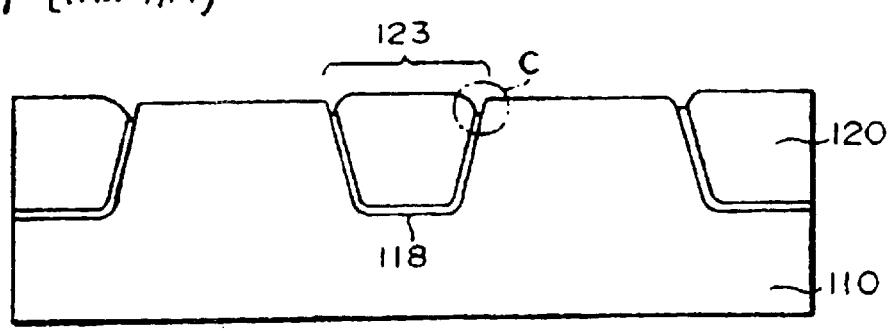

A semiconductor device in accordance with a second device embodiment of the present invention is described below. FIG. 33 shows a semiconductor device 200 in accordance with the second device embodiment.

In the first device embodiment, the silicon nitride layer 90 is used as an etching stopper layer for the trench oxide film 18. In accordance with a second device embodiment of the present invention, a semiconductor device 200 uses a non-monocrystal silicon layer 190 as an etching stopper layer for the trench oxide film 18. The non-monocrystal silicon layer may be a polysilicon layer, an amorphous silicon layer or a multiple layered structure including a polysilicon layer and an amorphous silicon layer. The semiconductor device 200 of the second embodiment is different from the semiconductor device 100 of the first embodiment in that the non-monocrystal silicon layer 190 is formed instead of a silicon nitride layer 90. Other features are the same as those of the first embodiment. Accordingly, elements that have the same functions are referred to with the same reference numbers, and their descriptions are omitted.

A method for manufacturing a semiconductor device in accordance with the second embodiment will be described below. The method for manufacturing a semiconductor device in accordance with the second device embodiment is different from the method for forming the first device embodiment in that a non-monocrystal silicon layer 190 is formed instead of a silicon nitride layer 90 as a layer to cover the trench oxide film 18. FIGS. 25-32 schematically show in cross section steps for manufacturing a semiconductor device of the second embodiment.

Figure 25:
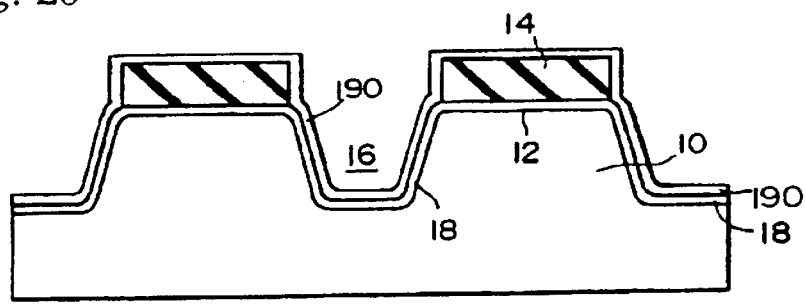
FIGS. 25-31 schematically show in cross section steps of manufacturing a semiconductor device in accordance with a second embodiment of the present invention.

First, the description will be made with reference to FIG. 25. The same steps as those of the method for forming the first device embodiment are conducted until the trench oxide film 18 is formed.

Then, a non-monocrystal silicon layer 190 is formed over the entire surface of the substrate including the surfaces of the trench oxide film 18. The non-monocrystal silicon layer 190 is formed from a polysilicon layer, an amorphous silicon layer or a multiple layered structure including a polysilicon layer and an amorphous silicon layer. The non-monocrystal silicon layer 190 functions to suppress the removal of the trench oxide film 18 when an isotropic etching with hydrofluoric acid is conducted in a later step that is described below. In other words, the non-monocrystal silicon layer 190 functions as an etching stopper layer for the trench oxide film 18 when an isotropic etching with a hydrofluoric acid is conducted. The detail of the function of the non-monocrystal silicon layer 190 will be described later with the description of an isotropic etching of a sacrificial oxide layer 24. The non-monocrystal silicon layer 190 may be formed by, for example, a CVD method. The non-monocrystal silicon layer 190 may not be limited to a specific thickness and may be of any thickness if the non-monocrystal silicon layer 190 can perform the function. Preferably, the non-monocrystal layer 190 may have a film thickness of 20–50 nm. When the thickness of the non-monocrystal layer 190 is 20 nm or greater, the non-monocrystal layer 190 can securely perform the function as an etching stopper layer for the trench oxide film 18. When the thickness of the non-monocrystal layer 190 is 50 nm or less, an insulating layer 21 (that is to be described later) can be better embedded in the trench 16. In other words, if the thickness of the non-monocrystal silicon layer 190 is greater than 50 nm, the trench 16 becomes narrow, and the aspect ratio of the trench 16 (the depth of the trench/the width of the trench) becomes great. This tends to make it more difficult to embed the insulating layer 21 in the trench 16.

Figure 26:
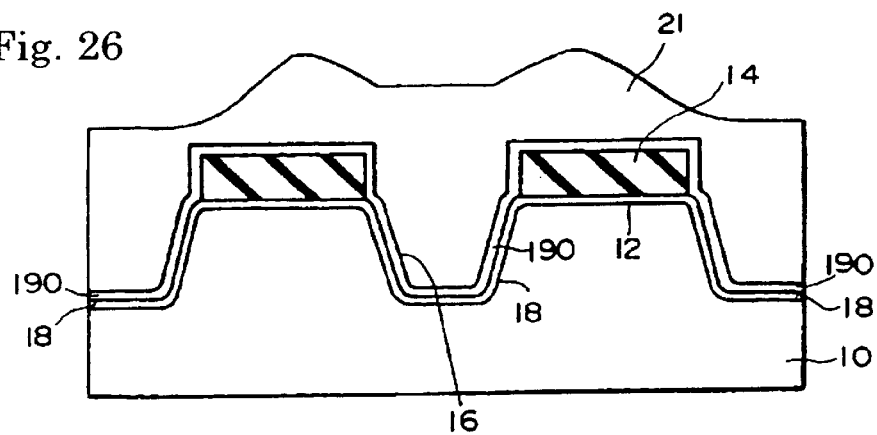
Figure 27:
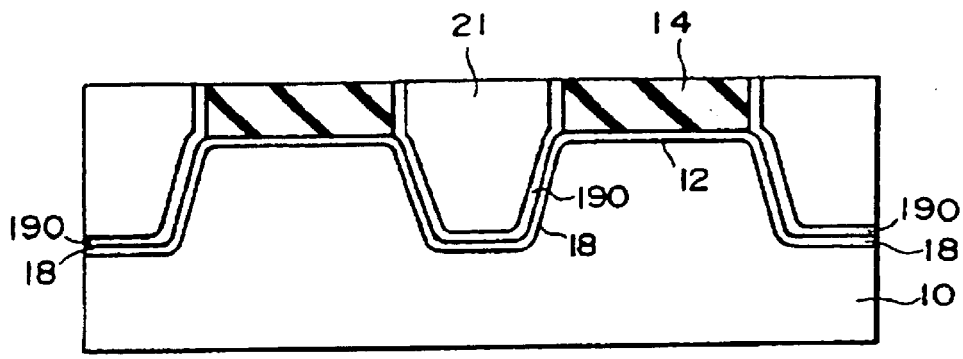

Then, as shown in FIG. 26, an insulating layer 21 composed of silicon oxide is deposited over the entire surface of the substrate in such a manner as to embed the trench 16. The insulating layer has the same features as those of the first device embodiment Then, as shown in FIG. 27, the insulating layer 21 is planarized by a CMP method. The planarization is conducted until the polishing stopper layer 14 is exposed. In other words, the insulating layer 21 is planarized, using the polishing stopper layer 14 as a stopper.

Figure 28:
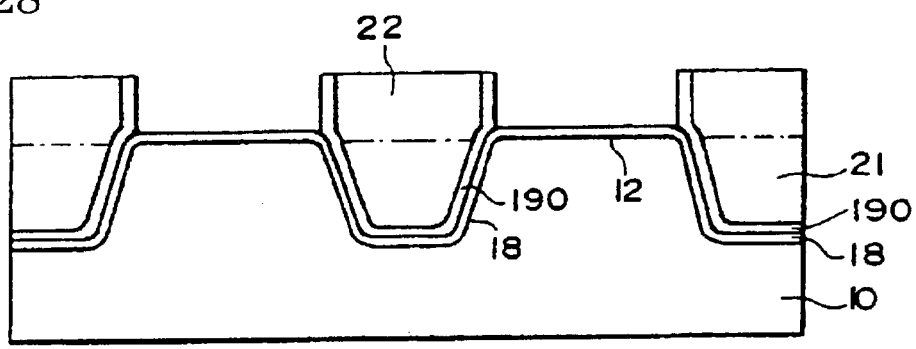

Then, as shown in FIG. 28, the polishing stopper layer 14 is removed, using a heated phosphoric acid, for example. After the polishing stopper layer 14 is removed, a portion of the insulating layer 21 that protrudes from the surface of the silicon substrate 10 remains. The portion of the insulating layer 21 that protrudes from the surface of the silicon substrate 10 in the device forming region will be referred to below as a "protruded portion 22 of the insulating layer".

Figure 29:
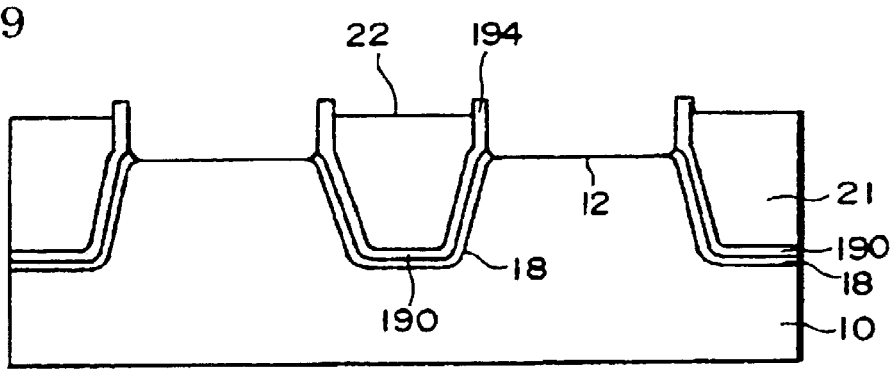

Next, as shown in FIG. 29, the pad layer 12 and the protruded portion 22 of the insulating layer are isotropically etched, using a hydrofluoric acid. Hereunder, the step of isotropic etching is referred to as the "step of light etching of the pad layer 12". In accordance with the present embodiment, the sidewalls of the protruded portion 22 of the insulating layer are covered by the non-monocrystal silicon layers 190. The non-monocrystal silicon layer 190 is barely, if at all, removed by the hydrofluoric acid, compared with the insulating layer 21. Therefore, the sidewall sections of the protruded section 22 of the insulating layer are protected by the non-monocrystal silicon layer 190, and are not removed. As a result, in accordance with the second embodiment of the present invention, a recess 21a (see FIG. 38) is not formed in the insulating layer 21 in the step of light etching of the pad layer 12.

Figure 30:
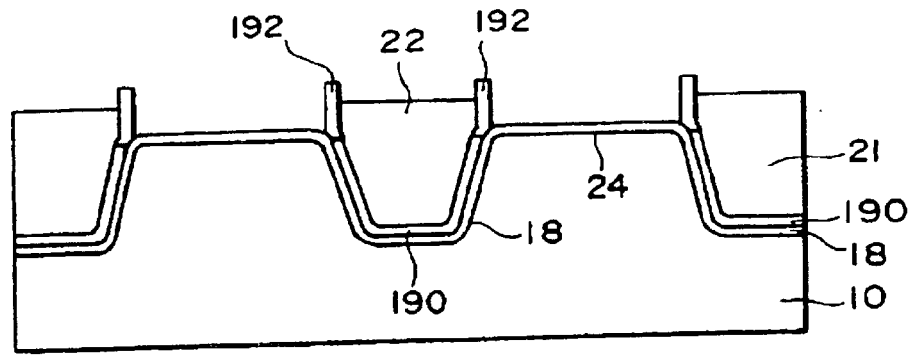

Next, as shown in FIG. 30, a sacrificial oxide layer 24 composed of silicon oxide on the exposed surface of the silicon substrate 10 by a thermal oxidation method. The sacrificial oxide layer 24 may have a film thickness of 10–20 nm, for example. A portion 194 (see FIG. 29) that protrudes from the surface of the substrate in the element forming region is oxidized by the thermal oxidation, and a silicon oxide film 192 is formed, as shown in FIG. 30. The thermal oxidation method is not limited to a specific method, but it may preferably be conducted by a wet oxidation (in which a thermal oxidation is conducted under the presence of water vapor) or a dry oxidation (in which a thermal oxidation is conducted in an oxygen atmosphere or a mixed gas containing oxygen and an inert gas). The thermal oxidation temperature in the wet oxidation is 750–850° C., for example, depending on the controllability of the film thickness. The thermal oxidation temperature in the dry oxidation is 800–900° C., for example. The inert gas used in the dry oxidation includes, for example, at least one of helium, neon, argon and krypton.

Then, an n-type retrograded well and a p-type retrograded well are formed in the same manner as for forming the first device embodiment.

Figure 31:
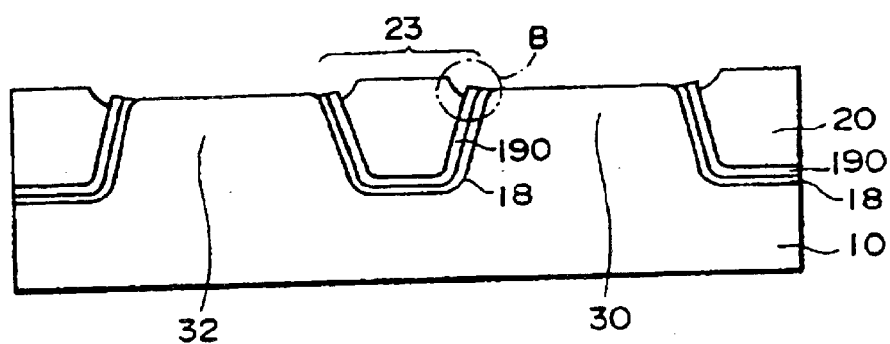

As shown in FIG. 31, the sacrificial oxide film 24, the protruded portion 22 of the insulating layer and the silicon oxide film 192 are isotropically etched by a hydrofluoric acid, to thereby form a trench insulating layer 20. As a result, a trench element isolation region 23 is formed. The step of isotropic etching is referred below as the "step of light etching the sacrificial oxide film 24".

Figure 32:
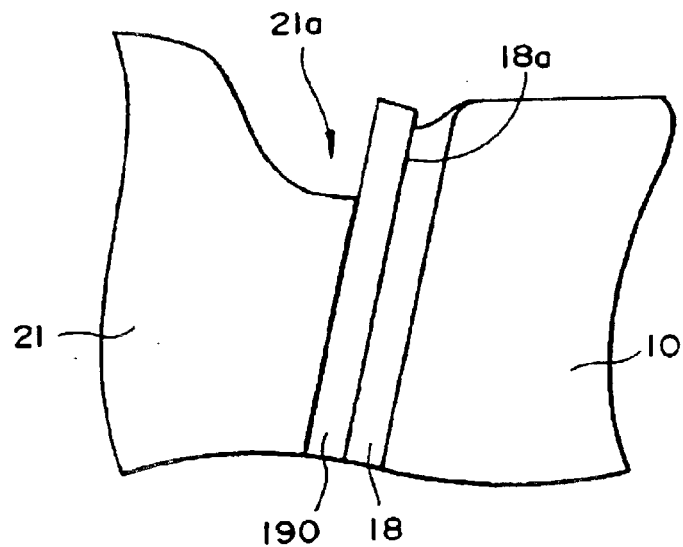
FIG. 32 schematically shows an expanded view of section B of FIG. 31.

In step of light etching of the sacrificial oxide film 24, the non-monocrystal silicon layer 190 performs the following functions. FIG. 32 illustratively shows an expanded view of section B of FIG. 31. When the insulating layer 22 and the silicon oxide film 192 are isotropically etched, a recess 21a is created at an upper end section of the insulating layer 21, as shown in FIG. 32. In the conventional technique, when a recess 21a is created, a trench oxide film 18 is exposed, and the exposed trench oxide film 18 is removed (see FIG. 38). However, in accordance with the embodiment of the present invention, even when the recess 21a is created, the formed non-monocrystal silicon layer 190 makes the trench oxide film 18 more difficult to be removed compared with the prior technique because of the following reasons.

In accordance with this embodiment, the non-monocrystal silicon layer 190 is formed to cover the trench oxide film 18. The non-monocrystal silicon layer 190 is barely, if at all, removed by the hydrofluoric acid, compared with the insulating layer 21. Therefore, even when the recess 21a is created, the non-monocrystal silicon layer 190 functions as an etching stopper layer to protect the trench oxide film 18, such that the surface 18a of the trench oxide film 18 on the side of the recess 21a is not exposed. Therefore, etching of the trench oxide film 18 in a lateral direction (from the side of the recess 21a) does not progress. As a result of the formed non-monocrystal silicon layer 190, the trench oxide film 18 becomes more difficult to be removed compared with the conventional technique.

When the step of light etching of the sacrificial oxide film 24 is completed, the recess 21a may preferably have a depth of 10 nm or less. When the depth of the recess 21a is 10 nm or less, deficiencies such as humps can be more securely suppressed.

Gate electrodes, sources and drains are formed in the same manner as the first embodiment, whereby a semiconductor device 200 shown in FIG. 33 is completed.

The embodiment may provide the following characteristic feature. Namely, the non-monocrystal silicon layer 190 that covers the trench oxide film 18 is formed. By forming the non-monocrystal silicon layer 190, the trench oxide film 18 becomes difficult to be removed in a variety of light etching steps. As a result, the embodiment provides a semiconductor device in which deficiencies in the transistor characteristic, such as the narrow inverse channel effect and bumps, are suppressed to a minimum level or are not created.

Also, in accordance with the method for manufacturing the semiconductor device of the embodiment described above, etching of the trench oxide film 18 from the side is difficult to progress. Accordingly, the trench oxide film 18 can be made thinner. As a result, the method is particularly useful when the miniaturization of semiconductor devices is sought. More particularly, the method is particularly useful when the design rule is 0.18 $\mu$m or smaller.

In the step of light etching of the pad layer 12, a hydrofluoric acid is used as an etchant. However, the etchant used in this light etching step is not limited to a hydrofluoric acid, and can be any etchant that can etch the pad layer 12 and the insulating layer 21 at the same time and provides a preferred selection ratio between the non-monocrystal silicon layer 190 and the insulating layer 21 (an etching rate of the insulating layer/an etching rate of the non-monocrystal silicon layer) to be 10 or greater. When hydrofluoric acid is used, a variety of materials may be added to the hydrofluoric acid as long as the condition described above is met.

Also, in the light etching of the sacrificial oxide film 24, the etchant is not limited to a hydrofluoric acid, and can be any etchant that can etch the sacrificial oxide layer 24 and the insulating layer 21 at the same time and provides a preferred selection ratio between the non-monocrystal silicon layer 190 and the insulating layer 21 (an etching rate of the insulating layer/an etching rate of the non-monocrystal silicon layer) to be 10 or greater. When hydrofluoric acid is used, a variety of materials may be added to the hydrofluoric acid as long as the condition described above is met.

The present invention is not limited to the embodiments described above, but is applicable to other embodiments within the scope of the subject matter of the present invention.

What is claimed:

1. A method for manufacturing a semiconductor device having a trench element isolation region including a trench and a trench insulating layer that fills the trench, the method comprising the steps of:
   (A) forming a pad oxide layer on a substrate;
   (B) forming a polishing stopper layer on the pad oxide layer, the polishing stopper layer having a predetermined pattern for a chemical-mechanical polishing, the pad oxide layer positioned between the substrate and the polishing stopper layer,
   (C) removing a part of the pad oxide layer and the substrate using a mask layer including at least the polishing stopper layer as a mask to form a trench;
   (D) forming a trench oxide film on a surface of the substrate that forms the trench;
   (E) forming an insulating layer that fills the trench;
   (F) polishing the insulating layer by a chemical-mechanical polishing;
   (G) removing the polishing stopper layer;
   (H) etching a part of the insulating layer to form a trench insulating layer and etching the pad oxide layer remaining on the substrate adjacent to the trench; and
   (I) after the etching the remaining pad oxide layer, forming a sacrificial oxide layer on the substrate adjacent to the trench;
   wherein the method further includes the step (a) of forming an etching stopper layer for the trench oxide film over at least a portion of the trench oxide film, wherein the etching stopper layer is a silicon nitride layer and wherein, in the step (H), the etching stopper layer is more resistant to the etching than the insulating layer;
   wherein the etching stopper layer is formed to have an upper surface that is positioned no higher than an upper surface of the sacrificial oxide layer; and
   after the sacrificial oxide is formed, implanting an impurity into the substrate, and then removing the sacrificial oxide layer, wherein after the sacrificial oxide is removed, the insulating layer has an upper surface that is positioned higher than an upper surface of the etching stopper layer.

2. A method for manufacturing a semiconductor device according to claim 1, wherein the silicon nitride layer has a thickness of 10–50 nm.

3. A method for manufacturing a semiconductor device, comprising:
   forming a trench comprising a lower surface and side surfaces in a silicon substrate;
   forming a trench oxide layer covering the lower surface and side surfaces;
   forming rounded corner regions at an intersection of an upper surface of the substrate and the side surfaces of the trench;
   forming an etch stop layer in direct contact with the trench oxide layer on the lower surface and side surfaces;
   filling the trench with an insulating layer directly contacting the etch stop layer, wherein the insulating layer overfills the trench and a portion of the insulation layer extends over the upper surface of the substrate;
   etching the insulating layer using an etchant that selectively etches the etch stop layer at a rate that is slower than that of the insulating layer, wherein the etching the insulating layer is carried out so that a first portion of the insulating layer that extends over the upper surface of the substrate is removed and a second portion of the insulating layer over the trench extends to a level above that of the upper surface of the substrate; and
   after the etching the insulating layer, implanting an impurity into a first region of the silicon substrate, implanting an impurity into a second region of the silicon substrate, and after the implanting the impurity into the second region, etching the second portion of the insulating layer, wherein the etching is controlled so that the second portion of the insulating layer extends to a level above that of the upper surface of the substrate.

4. A method as in claim 3, further comprising forming an oxide layer on the upper surface of the substrate after the etching the insulating layer and prior to the implanting.

5. A method as in claim 3, further comprising forming the trench so that an angle at an intersection between the lower surface of the trench and a side surface of the trench is greater than 90 degrees.

6. A method for manufacturing a semiconductor device, comprising:

forming a pad insulating layer on a silicon substrate;

forming a polishing stopper layer on the pad insulating layer;

forming a first resist layer having a specified pattern on the polishing stopper layer etching the polishing stopper layer and the pad insulating layer using the first resist layer as a mask to yield a remaining polishing stopper layer and remaining pad insulation layer;

removing the first resist layer;

etching the silicon substrate using the remaining polishing stopper layer and remaining pad insulation layer as a mask, to form a trench in the silicon substrate;

oxidizing surfaces in the trench;

forming a silicon nitride layer on the oxidized surfaces in the trench;

forming an insulating layer on the silicon nitride layer and overfilling the trench;

planarizing the insulating layer that overfills the trench until the polishing stopper layer is reached;

removing the remaining polishing stopper layer;

etching the remaining pad insulation layer and the insulating layer so that a portion of the insulating layer extends to a level higher than that of the silicon substrate;

performing at least one ion implantation while the insulation layer extends to a level higher than that of the silicon substrate; and etching the insulation layer after the at least one ion implantation so that the insulation layer extends to a level higher than that of the silicon substrate.

7. A method as in claim 6, further comprising forming the trench so that an angle at an intersection between the lower surface of the trench and a side surface of the trench is greater than 90 degrees.

8. A method for manufacturing a semiconductor device, comprising:

forming a pad insulating layer on a silicon substrate;

forming a polishing stopper layer on the pad layer above an upper surface of the silicon substrate;

forming a first resist layer having a specified pattern on the polishing stopper layer;

etching the polishing stopper layer and the pad insulating layer using the first resist layer as a mask to yield a remaining polishing stopper layer and remaining pad insulation layer;

removing the first resist layer;

etching the silicon substrate using the remaining polishing stopper layer and remaining pad insulation layer as a mask, to form a trench in the silicon substrate;

oxidizing surfaces in the trench;

forming an etch stop layer on the oxidized surfaces in the trench and on side surfaces and an upper surface of the polishing stopper layer;

forming an insulating layer on the etch stop layer and overfilling the trench;

planarizing the insulating layer that overfills the trench;

after the planarizing, etching the polishing stopper layer and the etch stop layer so that the polishing stopper layer is removed and the etch stop layer that extends to a level above the upper surface of the silicon substrate is removed;

after the etching the polishing stopper layer, etching the remaining pad insulation layer and the insulating layer so that a portion of the insulating layer remains at a level higher than that of the silicon substrate and the etch stop layer;

forming a sacrificial oxide layer on the silicon substrate;

performing at least one ion implantation into the silicon substrate while the insulation layer extends to a level higher than that of the silicon substrate and the etch stop layer; and etching the sacrificial oxide layer and the insulation layer after the at least one ion implantation, wherein the etching is controlled so that the insulation layer extends to a level higher than that of the silicon substrate.

9. A method as in claim 8, wherein the etch stop layer comprises a silicon nitride layer.

10. A method as in claim 8, wherein the etch stop layer is a non-monocrystal silicon layer.

11. A method for manufacturing a semiconductor device according claim 8, wherein the non-monocrystal silicon layer is an amorphous silicon layer.

12. A method for manufacturing a semiconductor device according claim 8, wherein the non-monocrystal silicon layer is a polycrystal silicon layer.

13. A method for manufacturing a semiconductor device according claim 8, wherein the non-monocrystal silicon layer comprises a multi-layer structure including a polycrystal silicon layer and an amorphous silicon layer.

14. A method as in claim 8, wherein the etching the remaining pad insulation layer and the insulating layer includes isotropically etching the insulating layer.

15. A method as in claim 14, wherein the isotropically etching the insulating layer includes forming recessed side regions in the insulating layer adjacent to the silicon nitride layer.

16. A method for manufacturing a semiconductor device, comprising:

forming a pad insulating layer on a silicon substrate;

forming a polishing stopper layer on the pad layer above an upper surface of the silicon substrate;

etching the polishing stopper layer and the pad insulating layer using a mask to yield a remaining polishing stopper layer and remaining pad insulation layer;

etching the silicon substrate using the remaining polishing stopper layer and remaining pad insulation layer as a mask, to form a trench in the silicon substrate;

oxidizing surfaces in the trench;

forming an etch stop layer on the oxidized surfaces in the trench and on side surfaces and an upper surface of the polishing stopper layer;

forming an insulating layer on the etch stop layer and overfilling the trench;

planarizing the insulating layer that overfills the trench to a level that exposes the polishing stopper layer;

after the planarizing, etching the polishing stopper layer and the etch stop layer so that the polishing stopper layer is removed and the etch stop layer on the side surfaces of the polishing stopper layer is removed; and after the etching the polishing stopper layer and the etch stop layer, etching the remaining pad insulation layer and the insulating layer so that a portion of the insulating layer remains at a level higher than that of the silicon substrate and the etch stop layer;

wherein the etch stop layer is formed from a non-monocrystal silicon layer selected from the group consisting of a polycrystal silicon layer, an amorphous silicon layer or a multiple layer having a polycrystal silicon layer and an amorphous silicon layer.

17. A method as in claim 16, wherein the etch stop layer is a silicon nitride layer.

18. A method as in claim 16, wherein the etch stop layer is formed from an amorphous silicon layer.

19. A method as in claim 16, wherein the etch stop layer is formed from a polycrystal silicon layer.

20. A method as in claim 16, wherein the etch stop layer is formed from a multiple layer having a polycrystal silicon layer and an amorphous silicon layer.

21. A method for manufacturing a semiconductor device, comprising:

forming a pad insulating layer on a substrate;

forming a polishing stopper layer on the pad insulating layer, wherein the pad insulating layer is between the substrate and the polishing stopper layer;

etching the polishing stopper layer and the pad insulating layer using a mask to yield a remaining polishing stopper layer and remaining pad insulation layer;

etching the substrate using the remaining polishing stopper layer and remaining pad insulation layer as a mask, to form a plurality of trenches in the substrate that are spaced apart from each other;

oxidizing surfaces in the trenches;

forming an etch stop layer on the oxidized surfaces in the trenches and on side surfaces and an upper surface of the remaining polishing stopper layer;

forming an insulating layer on the etch stop layer and overfilling the trenches;

planarizing the insulating layer that overfills the trenches to a level that exposes the remaining polishing stopper layer;

after the planarizing, etching the remaining polishing stopper layer and the etch stop layer so that the remaining polishing stopper layer is removed and the etch stop layer on the side surfaces of the remaining polishing stopper layer is removed;

after the etching the polishing stopper layer and the etch stop layer, etching the remaining pad insulation layer and a portion of the insulating layer so that the remaining pad insulation layer is removed and the substrate is exposed between the trenches;

after the etching the remaining pad insulation layer, forming an oxide layer on the exposed substrate between the trenches performing at least one ion implantation into the substrate through the oxide layer; and etching the oxide layer and the insulation layer after the at least one ion implantation, wherein the etching is controlled so that the insulation layer extends to a level higher than that of the substrate.

22. A method as in claim 21, wherein the etching the remaining pad insulation layer and a portion of the insulation layer is controlled so that a portion of the insulating layer remains at a level higher than that of the etch stop layer.

23. A method as in claim 22, further comprising performing at least one ion implantation into the substrate while the insulation layer extends to a level higher than that of the etch stop layer.

* * * * *